(12) United States Patent
Yoshida

(10) Patent No.: US 7,555,025 B2
(45) Date of Patent: Jun. 30, 2009

(54) SEMICONDUCTOR LASER DEVICE

(75) Inventor: Yasuaki Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/934,159

(22) Filed: Nov. 2, 2007

(65) Prior Publication Data
US 2008/0219313 A1 Sep. 11, 2008

(30) Foreign Application Priority Data
Mar. 7, 2007 (JP) .............................. 2007-056909

(51) Int. Cl.
*H01S 5/00* (2006.01)
(52) U.S. Cl. ................. 372/49.01; 372/46.013
(58) Field of Classification Search ............ 372/46.013, 372/49.01, 50.1
See application file for complete search history.

(56) References Cited

U.S. PATENT DOCUMENTS

| 1,953,998 | A | * | 4/1934 | Truesdale et al. ............ 205/333 |
| 5,899,709 | A | * | 5/1999 | Yamazaki et al. ............ 438/151 |
| 7,003,009 | B2 | | 2/2006 | Arakida et al. |
| 7,106,775 | B2 | | 9/2006 | Matsuoka et al. |
| 2006/0133442 | A1 | * | 6/2006 | Kondou et al. ............ 372/49.01 |

FOREIGN PATENT DOCUMENTS

| JP | 59-232477 | | 12/1984 |
| JP | 3-145175 | | 6/1991 |
| JP | 2002-100830 | * | 4/2002 |
| JP | 2002-335053 | | 11/2002 |
| JP | 2003-264333 | | 9/2003 |
| JP | 2004-296903 | | 10/2004 |
| JP | 2006-203162 | | 8/2006 |

\* cited by examiner

*Primary Examiner*—Armando Rodriguez
(74) *Attorney, Agent, or Firm*—Leydig, Voit & Mayer, Ltd.

(57) ABSTRACT

A semiconductor laser device includes a cavity extending in a propagation direction of a laser beam (X-direction). A front facet is on one end of the cavity through which the laser beam is emitted. A rear facet is on the other end of the cavity. Further, an adhesive layer and a coating film are on the front facet, and an adhesive layer and a coating film are on the rear facet. The adhesive layers preferably have a thickness of 10 nm or less and preferably include an anodic oxide film of one of Al, Ti, Nb, Zr, Ta, Si, and Hf.

4 Claims, 3 Drawing Sheets

SEMICONDUCTOR LASER DEVICE

FIELD OF THE INVENTION

The present invention relates to a semiconductor laser device for use in optical disc systems or optical communications, and more particularly to a blue semiconductor laser device formed of gallium nitride semiconductor material.

BACKGROUND ART

Semiconductor laser devices have been widely used in optical disc systems and optical communications (see, e.g., Japanese patent publication No. JP-B-3080312, JP-A-2002-100830 and JP-A-2004-296903). These semiconductor laser devices include a cavity to generate a laser beam. The cavity has a front facet formed on one end thereof to emit the laser beam and has a rear facet formed on the other end. An insulating film, or coating film, is formed on each facet to reduce the operating current of the semiconductor laser, to prevent return of light, and to increase the output power.

Generally, in high power semiconductor lasers, a low reflectance coating film is formed on the front facet, and a high reflectance coating film is formed on the rear facet. Specifically, the reflectance of the coating film on the rear facet is typically 60% or higher, preferably 80% or higher. The reflectance of the coating film on the front facet, on the other hand, is determined based on the required characteristics of the semiconductor laser. (Lower reflectance does not necessarily guarantee higher laser performance.) For example, semiconductor lasers for exciting a fiber amplifier used in combination with a fiber grating employ a coating film having a reflectance of approximately 0.01-3%. General high power semiconductor lasers, on the other hand, employ a coating film having a reflectance of approximately 3-7%, or a coating film having a reflectance of approximately 7-20% when it is necessary to prevent return of light.

The coating films protect the facets, that is, they function as passivation films for the semiconductor interfaces (see, e.g., Japanese Patent Publication No. JP-A-2004-296903 noted above). However, depending on the coating method used, the facets may be damaged, resulting in degraded characteristics of the semiconductor laser. Therefore, it is important to select the appropriate coating method.

Japanese patent publication No. JP-A-1984-232477 discloses that an anodic oxide film may be formed to protect a GaInAsP semiconductor. In the case of conventional gallium nitride semiconductor lasers, on the other hand, it is known that the coating films tend to delaminate or peel off resulting in degradation of the facet surfaces. To prevent this, a structure has been proposed in which a thin film of a metal or an oxide thereof is inserted between a coating film and the underlying semiconductor as an adhesive layer (see, e.g., JP-A-2002-335053). Further, Japanese patent publication No. JP-A-2006-203162 proposes a structure in which a thin layer of hexagonal crystal is inserted between a coating film and the underlying semiconductor as an adhesive layer.

For reference, followings are prior art Japanese patent publications.
No. JP-B-3080312,
No. JP-A-2002-100830
No. JP-A-2004-296903
No. JP-A-1984-232477
No. JP-A-2006-203162

However, metal adhesive layers have low insulating properties (and may cause shorting). Further, a metal oxide film is difficult to form to a controlled thickness by sputtering. Further, although a coating film is preferably formed of amorphous or a single crystal, it is difficult to form a hexagonal single crystal.

The present invention has been devised to solve the above problems. It is, therefore, an object of the present invention to provide a semiconductor laser device in which an easy-to-form adhesive layer is provided between a coating film and the underlying semiconductor.

Other objects and advantages of the present invention will become apparent from the following description.

SUMMARY OF THE INVENTION

According to one aspect of the present invention, a gallium nitride semiconductor laser device comprises a cavity formed to extend in a propagation direction of a laser beam. A first facet is formed on one end of said cavity to emit said laser beam. A second facet is formed on the other end of said cavity. Further, an adhesive layer and a coating film are provided on at least one of said first and second facets, and said adhesive layer is preferably made up of an anodic oxide film of a metal or silicon.

Thus, the present invention provides an extended life for semiconductor laser device in which an adhesive layer is formed between a coating film and the underlying semiconductor.

DETAILED DESCRIPTION OF THE PREFERRED EMBODIMENTS

Preferred embodiments of the present invention will now be described with reference to the accompanying drawings. It should be noted that in the following figures, like numerals will be used to denote like or corresponding components to avoid undue repetition.

Figure 1:
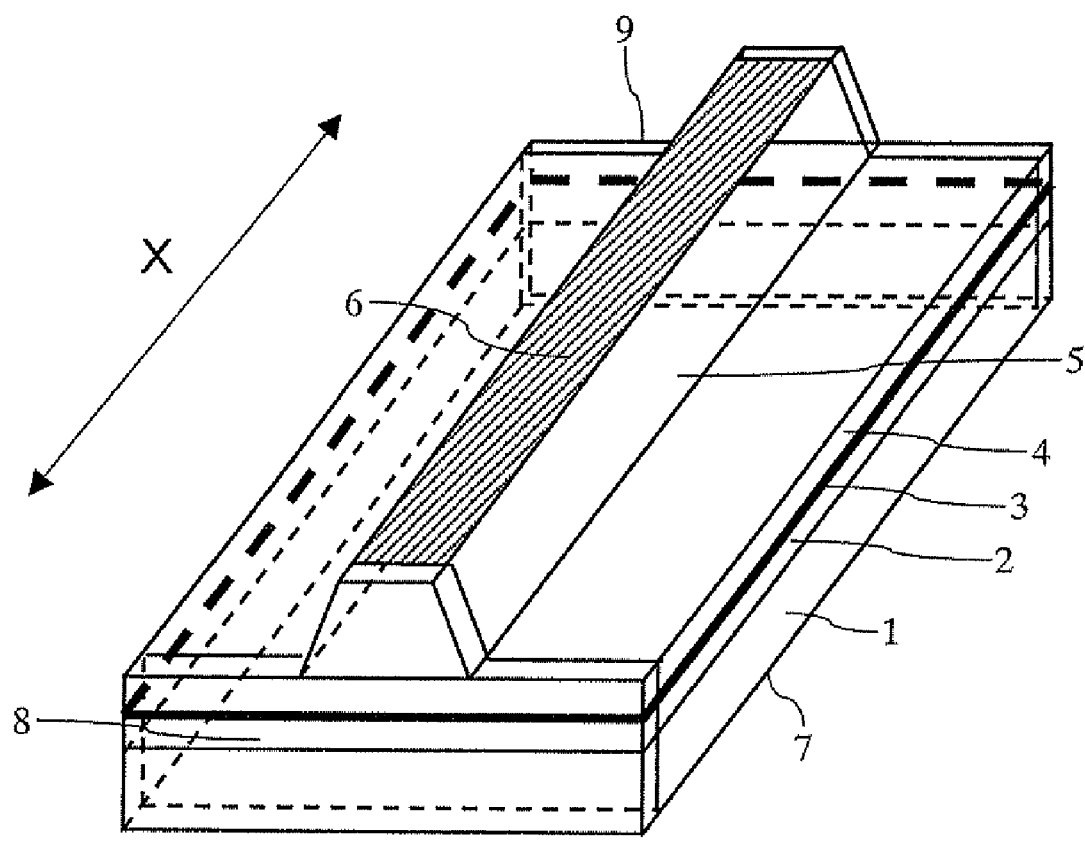
FIG. 1 is a perspective view of a semiconductor laser device according to an embodiment of the present invention.

FIG. 1 is a perspective view of a semiconductor laser device according to an embodiment of the present invention. This semiconductor device is a gallium nitride semiconductor laser device that emits a blue laser beam and employs a GaN substrate 1.

Referring to FIG. 1, an n-type cladding layer 2, an active layer 3, and a p-type cladding layer 4 are formed on the GaN substrate 1. The p-type cladding layer 4 has portions thereof removed by etching to form a ridge 5. A p-electrode 6 is provided on top of the ridge 5, and an n-electrode 7 is provided on the bottom surface of the GaN substrate 1. A specular surface is provided on each facet of the ridge, and a cavity is formed to extend in the X-direction (as shown in FIG. 1). The front facet 8 of the cavity, which is formed on one end of the cavity to emit a laser beam, is referred to as a "first facet" in the appended claims. The rear facet 9 of the cavity, which is formed on the other end of the cavity, is referred to as a "second facet" in the appended claims. The front facet 8 has a low reflectance, while the rear facet 9 has a high reflectance.

Figure 2A:
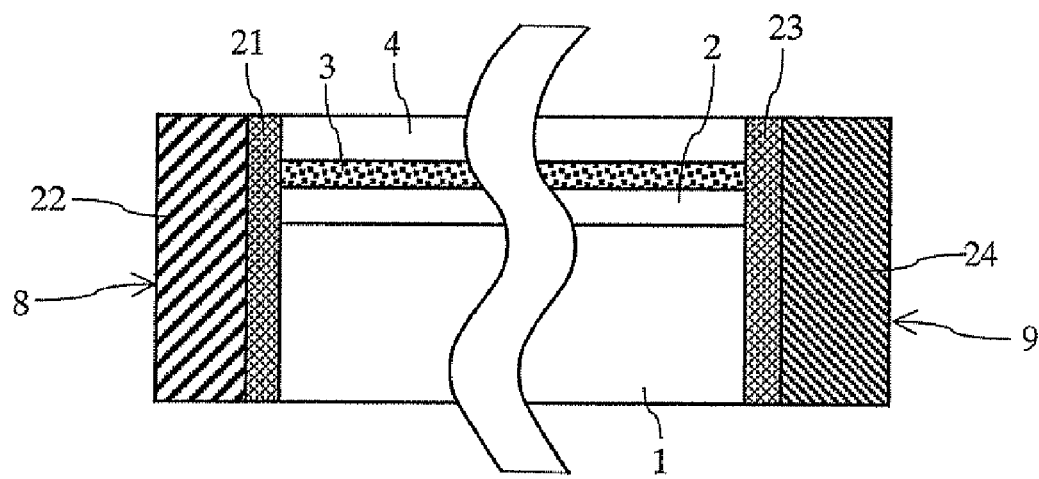
FIG. 2A is a schematic cross-sectional view of the end portions of the semiconductor laser device of Fig.

FIG. 2A is a schematic cross-sectional view of the end portions of the semiconductor laser device of FIG. 1 extending from the facets 8 and 9.

Referring to FIG. 2A, an adhesive layer 21 made up of an anodic oxide film of aluminum (Al) is formed on the front facet 8, and a coating film 22 of alumina ($Al_2O_3$) is formed on the adhesive layer 21. In order to avoid affecting the reflection and optical absorption characteristics of the facet, the adhesive layer (or anodic oxide film) 21 has a thickness of 20 nm or less, preferably 5 nm or less. The coating film 22, on the other hand, has a thickness of $\lambda/4n$ (where $\lambda$ is the wavelength of the laser beam and n is the refractive index of the dielectric film) in order to function as a low reflecting film. In this example, the thickness of the coating film 22 is actually 59 nm, since the oscillation wavelength of the laser is 400 nm and the refractive index of alumina is 1.7.

Referring still to FIG. 2A, an adhesive layer 23 made up of an anodic oxide film of aluminum (Al) is formed on the rear facet 9, and a coating film 24 made up of a multilayer dielectric film is formed on the adhesive layer 23. In order to avoid affecting the reflection and optical absorption characteristics of the facet, the adhesive layer 23 has a thickness of 20 nm or less, preferably 5 nm or less. The coating film 24, on the other hand, has a multilayer structure in order to function as a high reflecting film. Specifically, this coating film includes four layers structure composed of each layer of alumina ($Al_2O_3$) having a thickness of $\lambda/4n$ and each layer of tantalum oxide ($Ta_2O_5$) having a thickness of $\lambda/4n$. Further, a layer of alumina having a thickness of $\lambda/2n$ is formed on top of the film stack. Here, $\lambda$ is the wavelength of the laser beam and n is the refractive index of the dielectric film.

Figure 2B:
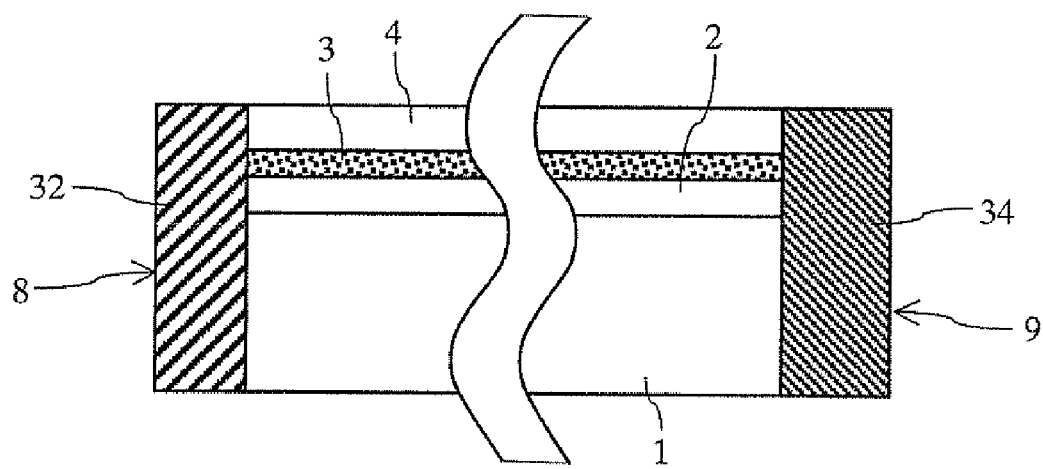
FIG. 2B shows a schematic cross-sectional view of the end portions of a conventional semiconductor laser device.

FIG. 2B shows, for comparison, a schematic cross-sectional view of the end portions of a conventional semiconductor laser device extending from both facets. Referring to FIG. 2B, a coating film 32 is formed on the front facet 8, and a coating film 34 is formed on the rear facet 9. This conventional semiconductor laser device differs from the semiconductor laser device shown in FIG. 2A in that it does not include the adhesive layers 21 and 23.

Thus, in the laser structure of the present invention shown in FIG. 2A, an adhesive layer is provided between each coating film and the underlying semiconductor to prevent delamination of the coating film, as disclosed in Japanese patent publication No. JP-A-2002-335053 and JP-A-2006-203162 noted above. Further, the anodic oxide films (or the adhesive layers) have high electrically insulating properties (as compared to metal films), since they are insulating films formed by oxidizing a metal. On the other hand, in the laser structure shown in FIG. 2B, since an adhesive layer is not provided between each coating film 32, 34 and the underlying semiconductor, the coating films tend to delaminate or peel off. The present invention has the following advantages over prior art techniques. The above inserted anodic oxide films enhance the adhesion between the coating films and the underlying nitride semiconductor. Japanese patent publication No. JP-A-1984-232477 noted above only discloses that an anodic oxide film may be formed to protect a GaInAsP semiconductor. Further, the present invention does not have the problems of reduced insulating ability and reduced thickness controllability associated with the prior art technique disclosed in the above Japanese patent publication No. JP-A-2002-3350053. Further, the laser structure of the present invention is easy to manufacture, as compared to the laser structure disclosed in the above Japanese patent publication No. JP-A-2006-203162.

There will now be described a method for manufacturing the nitride semiconductor laser according to the present embodiment.

First, the surfaces of a GaN substrate 1 are cleaned by thermal cleaning, etc., and then an n-type AlGaN cladding layer 2, an InGaN multiquantum well active layer 3, and a p-type AlGaN cladding layer 4 are sequentially formed on the GaN substrate 1 by metalorganic chemical vapor deposition (MOCVD).

After completion of the crystal growth of the above layers, the entire surface of the GaN substrate 1 is coated with a resist and this resist is processed into a resist pattern by photolithography. The resist pattern has a shape corresponding to the shape of the mesa portion to be formed. Next, the p-type cladding layer 4 is etched, for example, by RIE using the resist pattern as a mask to form a ridge stripe 5 (which will become the optical waveguide).

An $SiO_2$ film having a thickness of 0.2 μm is then formed over the entire surface of the GaN substrate 1 with the above resist pattern (which has been used as the mask) still thereon by CVD, vacuum deposition, sputtering, etc. The resist and the portion of the $SiO_2$ film on the ridge stripe 5 are then removed by lift-off, forming an opening on top of the ridge stripe 5.

Next, a Pt film and an Au film are sequentially formed over the entire surface of the GaN substrate 1, for example, by vacuum deposition. After that, a resist is applied and patterned by photolithography, and then wet or dry etching is performed to form the p-electrode 6 on the top of the ridge stripe 5.

After that, a Ti film and an Au film are sequentially formed on the substrate bottom surface by vacuum deposition, sputtering, etc., thus forming the n-electrode 7. An alloy process is performed to provide ohmic contact to the substrate if necessary.

Next, the GaN substrate 1 is cleaved, etc. into bars, forming the front facet 8 and the rear facet 9. A layer of aluminum is then deposited on the front facet 8 and the rear facet 9 of each bar to a thickness of 5 nm. Each bar is then placed on the lower electrode of a plasma anodizing apparatus with its front facet 8 up to anodize the aluminum layer on the front facet 8 and thereby form an adhesive layer 21 made up of an anodic oxide film of a metal (i.e., aluminum). Since this film is amorphous, it reduces, or compensates for, the irregularities of the crystal surface, thereby enhancing the adhesion between the facet and the coating film which is formed later in the process.

Figure 3:
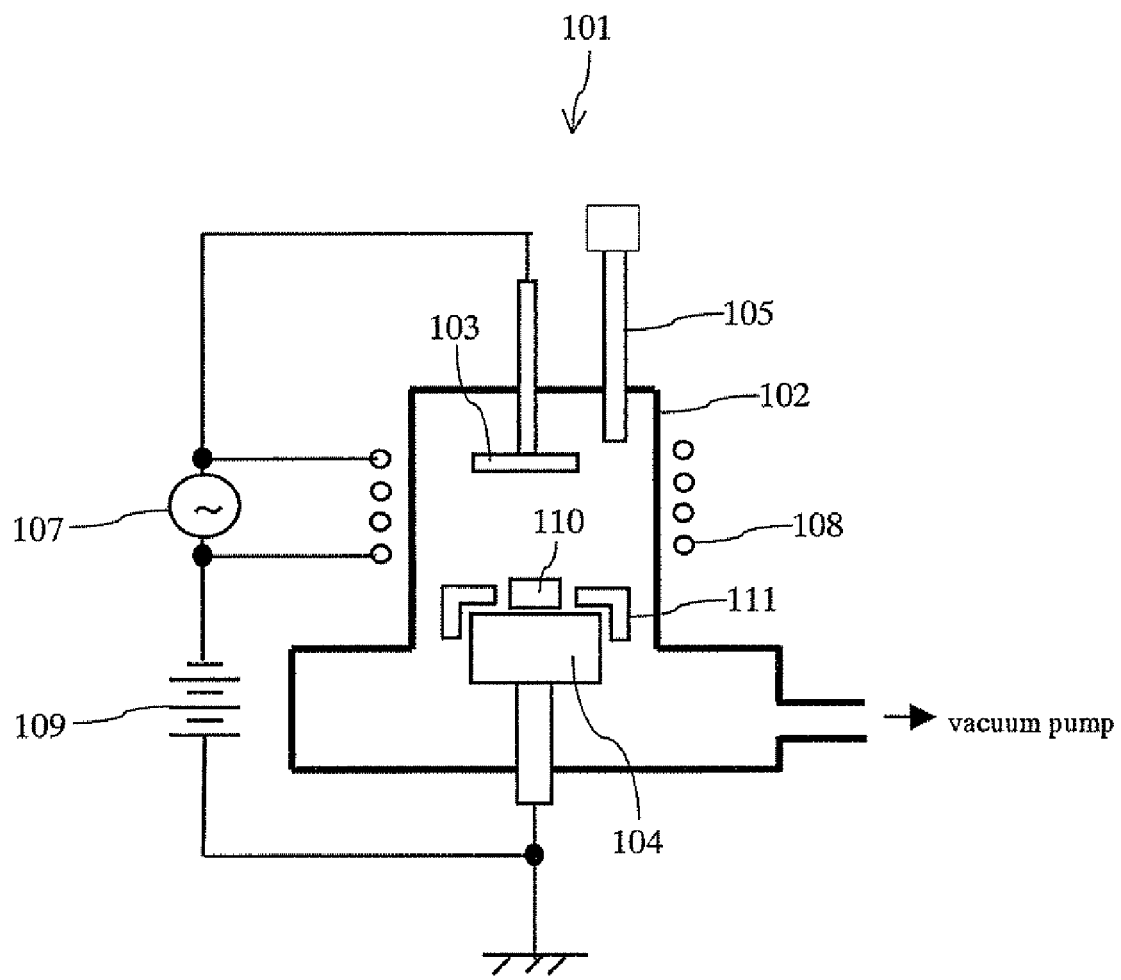
FIG. 3 is a diagram showing the configuration of a plasma anodizing apparatus.

FIG. 3 is a diagram showing the configuration of a plasma anodizing apparatus 101. Referring to FIG. 3, the plasma anodizing apparatus 101 includes a vacuum chamber 102, an upper electrode 103, a lower electrode 104, a gas feed tube 105, a vacuum pump (not shown), a high frequency power supply 107, a high frequency coil 108, and a DC power supply 109. A plasma anodizing process can form an oxide film to a controlled thickness of 20 nm or less at low temperature (100° C. or less). Furthermore, it does not require a solution, resulting in reduced risk of contamination. This ensures sufficient adhesion between the anodic oxide film and the coating film formed thereon later in the process.

After placing a bar 110 (obtained as described above) on the lower electrode 104, the vacuum chamber 102 is evacuated to a vacuum. Oxygen gas is then introduced through the gas feed tube 105. At that time, the flow and discharge rates of the oxygen gas are adjusted to maintain the oxygen pressure within the vacuum chamber 102 at approximately 0.1 Torr.

After the adjustment of the oxygen pressure, high frequency power is applied to the high frequency coil 108 to excite the oxygen gas into a plasma. The lower electrode 104 can be positioned within the plasma. However, it is usually disposed at a distance from the plasma to avoid damage to the bar 110 from the plasma. The lower electrode 104 can be water-cooled to a constant temperature. Further, those portions of the lower electrode 104 on which the bar 110 is not placed are covered with a quartz cover 111 to prevent oxidation of the lower electrode 104.

After the generation of the plasma, a positive bias (0-100 V) is applied to it to oxidize the front facet 8 with active oxygen and thereby form an anodic oxide film. The bias may be applied in a constant current mode to maintain the film-forming speed of the oxide film constant. This allows accurate control of the thickness of the thick oxide film (having a thickness of a few hundreds of nanometers). It should be noted that the anodic oxidation method has an advantage over the thermal oxidation method in that it can form a thick film at low temperature.

After anodizing the front facet 8, the bar 110 is retrieved from the chamber and then turned over with its rear facet 9 up and placed on the lower electrode 104 again to anodize the rear facet 9.

It is not necessary to anodize the bars 110 one by one. For example, a few tens of bars 110 may be stacked together and fixed to a jig and then placed in the vacuum chamber 102 to anodize them at a time. Further, instead of anodizing, or oxidizing, one facet of the bar face by face, both facets of the bar may be simultaneously oxidized by placing the bar in parallel to the plasma.

After forming the anodic oxide films as described above, a coating is formed to each facet of the cavity. The bar is then divided into chips. This completes the manufacture of a gallium nitride semiconductor laser device of the present invention.

It should be noted that the nitride semiconductor laser device of the present invention can be manufactured by a different method than that described above. For example, the formation of the metal layers and the plasma anodization described above may be carried out by the same apparatus instead of separate apparatuses.

Further, before anodizing each facet of the bar, the facet may be exposed to the plasma without applying a voltage to the plasma, in order to clean the facet and thereby enhance the adhesion between the anodic oxide film and the facet. In this case, argon may be used as the plasma gas.

Further, after anodizing the facets of the bar 110, the bar 110 may be annealed at 200-600° C. to stabilize the fixed charge within the anodic oxide films and thereby reduce variations in the characteristics of the laser device during operation. Such annealing can be performed within the vacuum chamber 102 if a heating coil is provided around the lower electrode 104. Alternatively, the bar may be retrieved from the vacuum chamber 102 and annealed by a dedicated apparatus.

Further, the anodic oxide films may be formed by using a solution such as KOH instead of using a plasma anodizing apparatus.

It should be understood that the present invention is not limited to the semiconductor laser device of the embodiment described above, and various alterations may be made thereto without departing from the spirit and scope of the invention.

For example, although, in the above embodiment, aluminum is used to form the adhesive layers, in other embodiments, a different metal may be used such as titanium (Ti), niobium (Nb), zirconium (Zr), tantalum (Ta), silicon (Si), or hafnium (Hf).

Further, although, in the above embodiment, the coating film 22 is a single-layer film of aluminum, in other embodiments, it may be a single-layer film of a different material such as aluminum nitride, amorphous silicon, aluminum oxide, titanium oxide, niobium oxide, zirconium oxide, tantalum oxide, silicon oxide, or hafnium oxide. It should be noted that such a single-layer film can be combined with any of the metals (for forming the adhesive layers) listed above.

Further, although, in the above embodiment, the coating film 24 is a multilayer film formed of alumina and tantalum oxide, in other embodiment, it may be a multilayer film formed of a combination of materials selected from the group consisting of aluminum nitride, amorphous silicon, aluminum oxide, titanium oxide, niobium oxide, zirconium oxide, tantalum oxide, silicon oxide, and hafnium oxide. Such a multilayer film can also function as a high reflecting film.

Further, although in the above embodiment, the coating film 22 having a thickness of $\lambda/4n$ is formed on the anodic metal oxide film 21, in other embodiments, a coating film having a thickness of $\lambda/2n$ may be formed on the anodic metal oxide film 21. In this case, the facet has a reflectance of approximately 18%, allowing the semiconductor laser to effectively prevent return of light.

Further, although in the above embodiment, the coating film 22, formed on the anodic metal oxide film 21, is a single-layer film having a thickness of $\lambda/4n$, in other embodiments, it may be a low reflecting multilayer film made of alumina, aluminum nitride, amorphous silicon, aluminum oxide, titanium oxide, niobium oxide, zirconium oxide, tantalum oxide, silicon oxide, hafnium oxide, etc. This multilayer film may be formed by vapor deposition, sputtering, etc. More specifically, the film may be formed, for example, by the method disclosed in the above Japanese patent publication No. JP-A-2004-296903 such that it has a layer structure providing a desired reflectance. It should be noted that a multilayer film exhibits reduced variation in reflectance with thickness, as compared to a single-layer film.

The entire disclosure of a Japanese Patent Application No. 2007-056909, filed on Mar. 7, 2007 including specification, claims, drawings and summary, on which the Convention priority of the present application is based, are incorporated herein by reference in its entirety.

The invention claimed is:

1. A gallium nitride semiconductor laser device comprising:
    a substrate, a first cladding layer, an active layer, and a second cladding layer, sequentially arranged, each of said first and second cladding layers and said active layer including at least Ga and N as principal constituents, and having opposed first and second facets defining a cavity extending in a propagation direction of a laser beam, said first facet being located at a first end of said cavity and through which the laser beam is emitted, and said second facet being located on a second end of said cavity; and
    an adhesive layer and a coating film sequentially disposed on at least one of said first and second facets, said adhesive layer being an anodic oxide film of a material selected from the group consisting of aluminum, titanium, niobium, tantalum, and hafnium, and in contact with at least one of said first and second facets.

2. The gallium nitride semiconductor laser device as claimed in claim 1, wherein said adhesive layer is no more than 10 nm thick.

3. The gallium nitride semiconductor laser device as claimed in claim 2, wherein said anodic oxide film is formed by plasma anodization.

4. The gallium nitride semiconductor laser device as claimed in claim 2, wherein said anodic oxide film is annealed at 200-600° C.

* * * * *